(12) United States Patent
Watanabe et al.

(10) Patent No.: US 7,961,077 B2
(45) Date of Patent: Jun. 14, 2011

(54) AUTHENTICITY DETERMINATION SYSTEM OF RESPONDER, IDENTIFICATION SYSTEM, AND INTERROGATION UNIT

(75) Inventors: Masao Watanabe, Ashigarakami-gun (JP); Hiroyuki Funo, Kanagawa (JP); Kiyoshi Iida, Ashigarakami-gun (JP); Ryota Mizutani, Ashigarakami-gun (JP); Yasuaki Konishi, Ashigarakami-gun (JP)

(73) Assignee: Fuji Xerox Co., Ltd., Tokyo (JP)

( * ) Notice: Subject to any disclaimer, the term of this patent is extended or adjusted under 35 U.S.C. 154(b) by 1176 days.

(21) Appl. No.: 11/657,674

(22) Filed: Jan. 25, 2007

(65) Prior Publication Data

US 2008/0024269 A1 Jan. 31, 2008

(30) Foreign Application Priority Data

Jul. 28, 2006 (JP) .................................. 2006-206187

(51) Int. Cl.
*G05B 19/00* (2006.01)
*H04B 1/00* (2006.01)
*H04Q 5/22* (2006.01)
*G01S 13/74* (2006.01)
*H01L 41/00* (2006.01)
*H02N 2/00* (2006.01)

(52) U.S. Cl. ...... 340/5.8; 340/10.1; 340/10.3; 340/10.4; 342/44; 310/313 R

(58) Field of Classification Search .......... 340/5.8–5.81, 340/10.4–10.42, 5.26, 10.1–10.6, 572.1–572.9, 340/3.51; 235/375–385, 436; 455/41.1–41.3, 455/106–107; 370/310–350, 230–230.1, 370/248–249, 235, 236; 342/44; 310/313 R–313 D
See application file for complete search history.

(56) References Cited

U.S. PATENT DOCUMENTS

| | | | | |
|---|---|---|---|---|
| 4,734,698 A * | 3/1988 | Nysen et al. | ..................... | 342/44 |
| 4,799,061 A * | 1/1989 | Abraham et al. | ............ | 340/5.26 |
| 5,144,667 A * | 9/1992 | Pogue et al. | ..................... | 380/45 |
| 5,523,746 A * | 6/1996 | Gallagher | ..................... | 340/5.61 |
| 5,596,317 A * | 1/1997 | Brinkmeyer et al. | ........ | 340/5.26 |
| 6,144,332 A | 11/2000 | Reindl et al. | | |
| 7,017,404 B1 * | 3/2006 | Kain | ........................... | 73/146.5 |
| 7,450,010 B1 * | 11/2008 | Gravelle et al. | ............ | 340/572.1 |

(Continued)

FOREIGN PATENT DOCUMENTS

JP A 7-502613 3/1995

(Continued)

OTHER PUBLICATIONS

L. Reindl et al., "Programmable Reflectors for SAW-ID-Tags", Ultrasonic Symposium, 1993, pp. 125-130.

*Primary Examiner* — Benjamin C Lee
*Assistant Examiner* — Michael Shannon
(74) *Attorney, Agent, or Firm* — Oliff & Berridge, PLC

(57) ABSTRACT

A responder authenticity determination system, comprising: a responder that sends a response signal in response to a received signal; an interrogation signal generator that generates an interrogation signal having a random waveform; a transceiver that sends the generated interrogation signal to the responder, and receives a response signal from the responder; and an authenticity determination unit that determines authenticity of the responder based on the received response signal and the random waveform of the generated interrogation signal.

10 Claims, 9 Drawing Sheets

U.S. PATENT DOCUMENTS

| | | | |
|---|---|---|---|
| 2004/0066278 A1* | 4/2004 | Hughes et al. | 340/10.1 |
| 2004/0085192 A1* | 5/2004 | Hartmann | 340/10.4 |
| 2005/0007238 A1* | 1/2005 | Hartmann et al. | 340/10.2 |
| 2005/0056950 A1* | 3/2005 | Dornbusch et al. | 257/786 |
| 2006/0290503 A1* | 12/2006 | Sumida et al. | 340/572.1 |
| 2007/0109099 A1* | 5/2007 | Raphaeli et al. | 340/10.2 |

FOREIGN PATENT DOCUMENTS

| | | |
|---|---|---|
| JP | A 9-508974 | 9/1997 |
| JP | A 2004-191334 | 7/2004 |

* cited by examiner

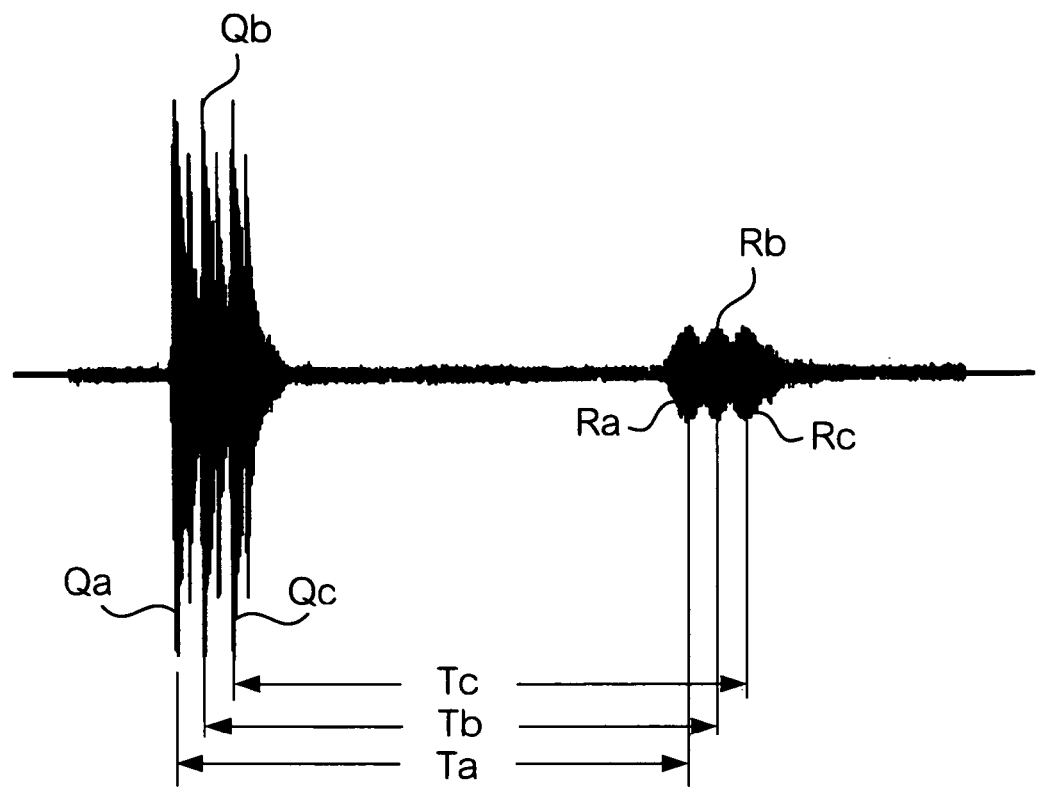

INTERROGATION REQUEST SIGNAL Q0

INTERROGATION SIGNAL Q

RESPONSE SIGNAL R

RESPONSE SIGNAL R1

RESPONSE SIGNAL R2

INTERROGATION REQUEST
SIGNAL Q0

THINNED SIGNAL T

INTERROGATION
SIGNAL Q

RESPONSE SIGNAL R

CORRECTION SIGNAL M

REVISED RESPONSE SIGNAL R0

AUTHENTICITY DETERMINATION SYSTEM OF RESPONDER, IDENTIFICATION SYSTEM, AND INTERROGATION UNIT

CROSS-REFERENCE TO RELATED APPLICATIONS

This application is based on and claims priority under 35 U.S.C. 119 from Japanese Patent Application No. 2006-206187 filed on Jul. 28, 2006.

BACKGROUND

1. Technical Field

The present invention generally relates to a technique for determining authenticity of a responder device by an interrogation device.

2. Related Art

There are known identification systems that include an interrogation unit that wirelessly emits an interrogation signal and a responder that receives the interrogation signal and replies with a response signal. In the system the responder is identified referring to the response signal received by the interrogation unit.

SUMMARY

In one exemplary embodiment, the configuration of the responder authenticity determination system according to an aspect of the present invention comprises a responder that sends a response signal in response to a received signal; an interrogation signal generator that generates an interrogation signal having a random waveform; a transceiver that sends the generated interrogation signal to the responder, and receives a response signal from the responder; and an authenticity determination unit that determines authenticity of the responder based on the received response signal and the random waveform of the generated interrogation signal.

BRIEF DESCRIPTION OF THE DRAWINGS

Exemplary embodiments of the present invention will be described in detail based on the following figures, wherein:

FIG. 3 shows the actual waveform of an interrogation signal sent to the RFID and a response signal sent as a reply from the RFID;

FIG. 4 shows an example of a characteristics table stored in a storage unit;

DETAILED DESCRIPTION

1. First Exemplary Embodiment

Figure 1:
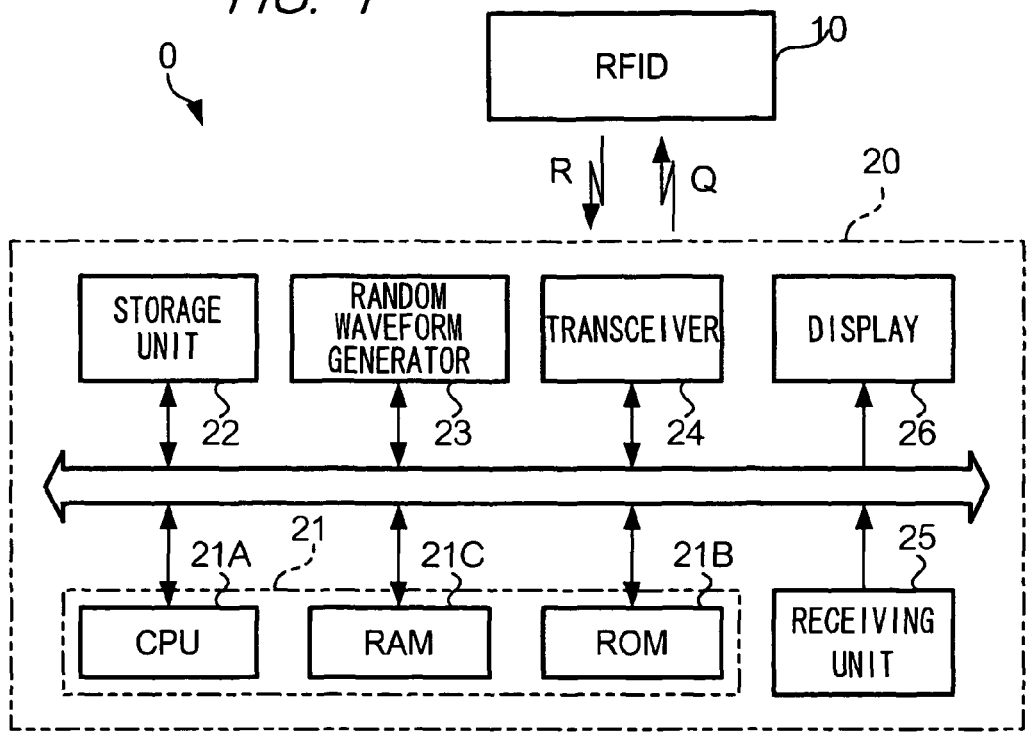
FIG. 1 is a block diagram that shows an authentication system according to a first exemplary embodiment.

Following is a description of a first exemplary embodiment of the present invention.
1-1. Configuration FIG. 1 is an overall configuration diagram of an authentication system according to the present exemplary embodiment.

This authentication system 0 is provided with an RFID 10 (radio frequency identification) employing a SAW (surface acoustic wave) and an interrogation unit 20 that wirelessly gives/receives a signal to/from the RFID 10.

Figure 2A:
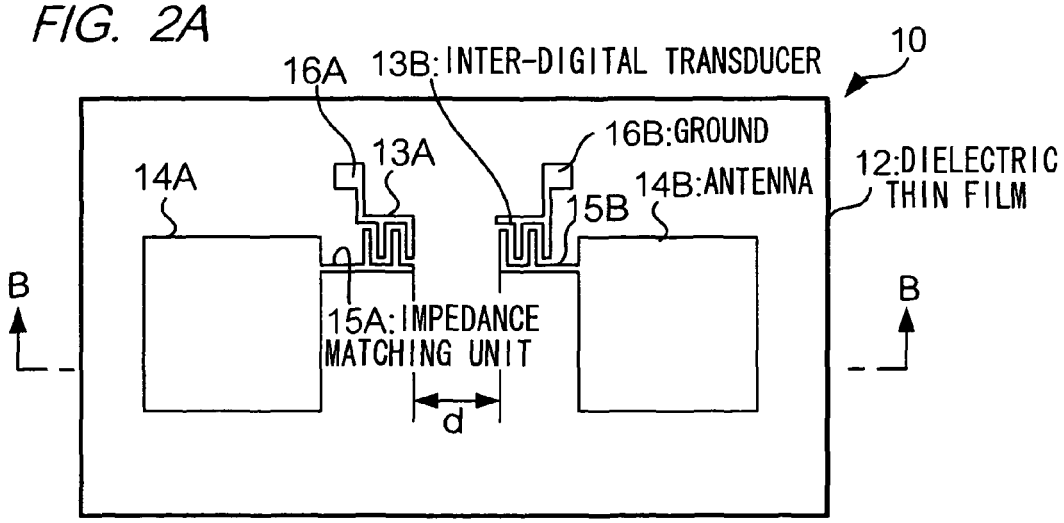
FIGS. 2A and 2B show an RFID used in the first exemplary embodiment.

In the present exemplary embodiment, an example is described in which, when a user performs a settlement process or the like, an authenticity process is executed to determine whether or not the RFID 10 possessed by the user is authentic, and a process to authenticate the RFID 10 is executed.
1-1-1. Configuration of RFID Here is a description of the RFID 10 with reference to FIG. 2.

Figure 2B:
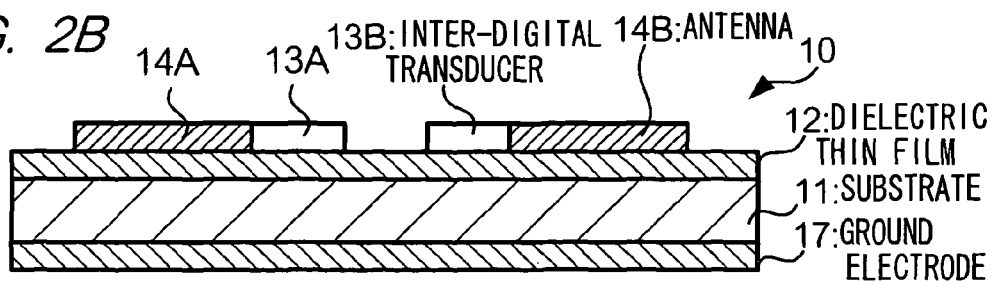

FIG. 2 shows the configuration of the RFID 10 according to the first exemplary embodiment. The RFID 10 includes a substrate 11 whose base is made of Si material, a dielectric thin film 12 in which a surface acoustic wave will propagate and that is formed via an oxide film 11A on the substrate 11, a pair of inter-digital transducers (IDTs) 13A and 13B that are formed on the dielectric thin film 12 and used as a conversion unit that converts an electrical signal into a surface acoustic wave or converts a surface acoustic wave into an electrical signal, antennas 14A and 14B connected to one side of the pair of inter-digital transducers 13A and 13B via impedance matching units 15A and 15B, the antennas 14A and 14B being used as transceiver units that transmit/receive a radio wave signal to/from an external sending/receiving device, grounds 16A and 16B connected to the other side of the pair of inter-digital transducers 13A and 13B, and a ground terminal 17 formed on the rear face of the substrate 11 and connected via a through-hole (not shown) to the grounds 16A and 16B.

The inter-digital transducers 13A and 13B, the antennas 14A and 14B, the impedance matching units 15A and 15B, and the grounds 16A and 16B are formed as a single body from a conductive pattern. As for the material of this conductive pattern, it is preferable to laminate a single layer of a metal such as Ti, Cr, Cu, W, Ni, Ta, Ga, In, Al, Pb, Pt, Au, or Ag, or an alloy such as Ti—Al, Al—Cu, Ti—N, or Ni—Cr, or to laminate two or more layers in a multi-layer structure, and Au, Ti, W, Al, and Cu are particularly preferable metals. Also, it is preferable that the thickness of this metal layer is not less than 1 nm and less than 10 µm.

From the viewpoint of the electromechanical coupling factor/piezoelectric coefficient in the inter-digital transducers 13, or dielectric loss of the antennas 14 or the like, the dielectric thin film 12 preferably has an epitaxial or single orientation. Also, a thin film including a III-V Group semiconductor of GaAs or the like, or containing a carbon such as diamond, may be formed on the dielectric thin film 12. Thus, the surface velocity, coupling factor, piezoelectric constant, and the like of the surface acoustic wave can be improved.

Next is a description of the specific operation of the RFID 10. In the plan view of the RFID 10 shown in FIG. 2A, for the sake of convenience it is assumed that, facing FIG. 2A, a signal moves from the left side to the right side, but actually the flow of the signal does not have directionality.

That is, the surface acoustic wave generated from the inter-digital transducer 13A is not only picked up at the inter-digital transducer 13B; that surface acoustic wave is reflected and returns to the inter-digital transducer 13A, and that reflection repeats with the surface acoustic wave attenuating each time. Further, the surface acoustic wave is also generated in the same manner from the other inter-digital transducer 13B, so the same operation is repeated.

In addition, the surface acoustic wave is generated such that it expands around the inter-digital transducer 13A, so there is some amount of reflection at the ends of the substrate 11, but that reflection is so small compared to the reflection of the other inter-digital transducer 13B that in actuality the reflection at the ends of the substrate 11 can be ignored.

The RFID 10 wirelessly sends/receives a signal to/from the interrogation unit 20. An interrogation signal Q of about 300 MHz received from the interrogation unit 20 is received by the antenna 14A, and mechanical vibration is generated by this signal due to the inter-digital transducer 13A exciting the dielectric film 12. This mechanical vibration generates a surface acoustic wave on the surface of the dielectric film 12. This surface acoustic wave moves from the inter-digital transducer 13A toward the inter-digital transducer 13B, and after the surface acoustic wave has reached the inter-digital transducer 13B, it is converted to an electrical signal by the inter-digital transducer 13B, and received via the antenna 14B as a response signal R.

Here, in the RFID 10, the propagation time of the surface acoustic wave varies according to a distance d from the inter-digital transducer 13A to the inter-digital transducer 13B, so varying propagation times are set by varying the distance d for each RFID 10.

In addition, when the propagation time of a wireless signal from the interrogation unit to the antenna 14 of the RFID 10 is T1, and the propagation time of the surface acoustic wave from the inter-digital transducer 13A to the inter-digital transducer 13B is T2, the relationship of those propagation times is T1<T2. Thus, although a measurement time T from receipt of the interrogation signal Q to receipt of the response signal R by the interrogation unit R is T1+T2, from the above relationship, in practice T is deemed to be equal to T2. Thus, the time T measured in the interrogation unit 20 is the propagation time T2 of the RFID 10.

In the interrogation unit 20, a propagation time T2 decided in advance for each RFID 10 is stored as an ID signal associated with an ID number. Also, in the interrogation unit 20, the measurement time T from receipt of the interrogation signal Q to receipt of the response signal R by the interrogation unit R is used as an ID-received signal, and this ID-received signal is compared to the ID signal. Thus, an ID signal the same as the ID-received signal is extracted, and the ID number of this ID signal is specified as the ID number of the measured RFID 10.

Additionally, FIG. 3 shows the actual waveform of the interrogation signal Q sent to a particular RFID 10 and the response signal R sent as a reply from that RFID 10. A response signal Ra to a first interrogation signal Qa, a response signal Rb to a second interrogation signal Qb, and a response signal Rc to a third interrogation signal Qc are each obtained. Here, a time Ta from the interrogation signal Qa to the response signal Ra, a time Tb from the interrogation signal Qb to the response signal Rb, and a time Tc from the interrogation signal Qc to the response signal Rc each have the ID signal for the same RFID 10, so the delay time for each is the same.

1-1-2. Configuration of Interrogation Unit

The interrogation unit 20, as shown in FIG. 1, includes a controller 21, a storage unit 22, a random waveform generator 23, a transceiver 24, a receiving unit 25, and a display 26.

Here, the controller 21 may be configured provided with, for example, a CPU (central processing unit) 21A, a ROM (read-only memory) 21B, and a RAM (random access memory) 21C. The ROM 21B, for example, stores a program that wirelessly sends/receives a signal to/from the RFID 10, a program for determining the authenticity of the RFID 10, a program for authenticating the RFID 10, plus a timer mechanism and also a parameter (such as a signal attenuation rate $\alpha$ in the RFID 10). The RAM 21C is used as a work area when executing the programs.

As shown in FIG. 4, a characteristic table 22A of ID signals (propagation times T2) corresponding to ID numbers is stored in the storage unit 22. As described above, in the characteristic table 22A a propagation time T2 decided in advance for each RFID 10 is stored as an ID signal associated with an ID number.

The random waveform generator 23 generates an interrogation signal Q, which is a command signal received from the controller 21 and is a random waveform, and will be described below in detail.

The transceiver 24 is provided with an antenna and converter (both not shown) that convert an electrical signal into a wireless signal. The transceiver 24 converts the interrogation signal Q generated by the random number generator 23 into a wireless signal and transmits that wireless signal to the RFID 10, and receives the response signal R sent as a reply from the RFID 10 and converts that response signal R into an electrical signal. In the controller 21, the time T from sending of the interrogation signal Q to receipt of the response signal R is measured by the timer mechanism.

The receiving unit 25 is configured with a keyboard such as a numeric keypad, and by receiving an ID number input by a user, starts an identification process described below. The display 26 is a monitor that displays the results of determining the authenticity of the RFID 10 and the results of authenticating the RFID 10.

1-2. Operation 1-2-1. Authentication Process

Next is a description of the operation of an authentication system according the present exemplary embodiment.

Figure 5:
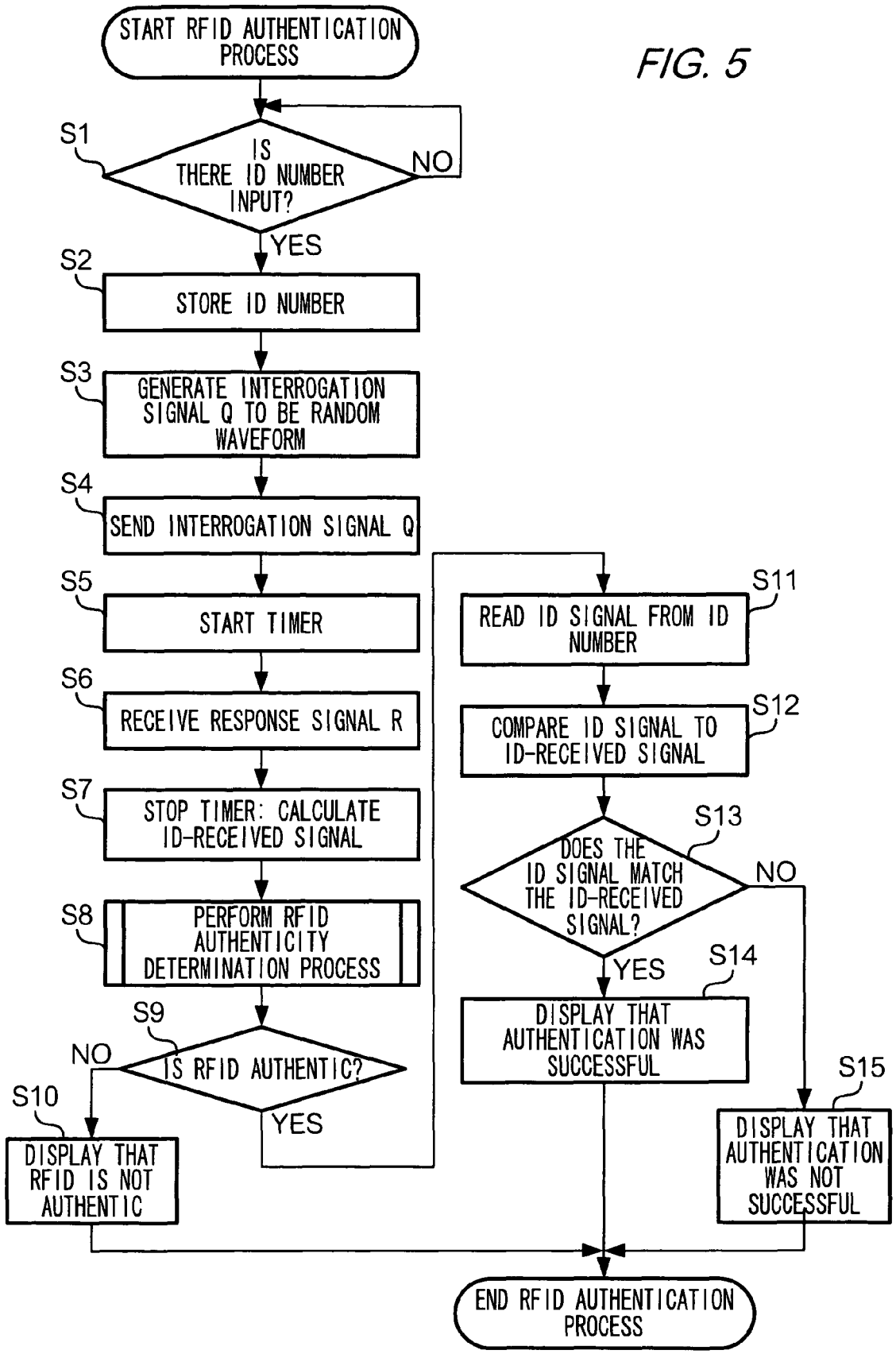
FIG. 5 is a flowchart that shows an authentication process according to the first exemplary embodiment.

FIG. 5 shows the flow of operation in the authentication system 0.

First, the controller 21 waits for an ID number input by the user to be received by the receiving unit 25 (Step S1). When an ID number that the user has decided in advance is received (Step S1; Yes), the controller 21 shifts to the following processing. The controller 21 temporarily stores the received ID number in the RAM 21C (Step S2). At this time, the controller 21 may check whether or not the ID number is present in the characteristic table 22A stored in the storage unit 22, and if not present, display a comment on the display 26 indicating that an incorrect ID number was input.

Next, the controller 21 requests that the random waveform generator 23 generate a random waveform. A interrogation signal Q, which is a random waveform, is generated by the random waveform generator 23 (Step S3). Further, the controller 21 converts this interrogation signal Q into a wireless signal with the transceiver 24 and sends the wireless signal to the RFID 10 (Step S4), and starts a timer (Step S5).

The RFID 10 receives the sent interrogation signal Q, and the operation described above is performed to send response signals R corresponding to individual RFIDs 10 as a reply.

When a response signal R is received by the transceiver 24 (Step S6), the controller 21 stops the timer, measures the time from sending of the interrogation signal Q to receipt of the response signal R, and stores this time in the RAM 21C as an ID-received signal (Step S7).

The controller 21 performs the RFID authenticity determination process (Step S8), and when the controller 21 has determined that the RFID 10 is authentic (Step S9; Yes), the controller 21 shifts to the processing of Step S11, and when the controller 21 has determined that the RFID 10 is not authentic (Step S9; No), the controller 21 displays that the RFID is not authentic on the display 26 and ends this process. In this case, all subsequent processing is prohibited.

On the other hand, when the RFID was determined to be authentic (Step S9; Yes), the controller 21 refers to the characteristic table 22A and reads the ID signal from the ID number stored in the RAM 21C (Step S11). Afterward, the controller 21 compares the ID signal that was read to the ID-received signal (Step S12).

When the ID signal and the ID-received signal match (Step S13; Yes), "Authentication successful" is displayed on the display 26, this process finishes, and then the operation shifts to the next process, such as, for example, a settlement process. On the other hand, when the ID signal and the ID-received signal do not match (Step S13; No), "Authentication failed" is displayed on the display 26, and this process ends. In this case, all subsequent processing is prohibited.

1-2-2. Authenticity Determination Operation

First, before describing this determination operation, generation of the interrogation signal Q in Step S3 in FIG. 5, i.e. generation of a random waveform in the random waveform generator 23, will be described. The circuit configuration of the random waveform generator 23 can be realized with a combination of logical circuits, so the details of the circuit configuration are omitted.

With the random waveform generator 23 in the present invention, as one example, a command signal is received from the controller 21 and six reference pulse waveforms with the same pulse width are generated, and by switching these pulse waveforms on or off, an interrogation signal Q, which is a random waveform, is generated. In the present exemplary embodiment, a random waveform is generated by six pulse waveforms, but the reference pulse waveforms for generating the random waveforms are not limited to six.

Following is a simple description of the "authenticity of the responder". An authentic responder is a responder for which a proper response is expected. On the other hand, an inauthentic responder is a responder that acquires an ID of an authentic responder by some method such as skimming or the like, and feigning to be an authentic responder, emits a response signal corresponding to that ID in response to interrogation from an interrogation unit. For example, a possibility is conceivable in which, when an inauthentic responder is active, using the interrogation signal merely as a trigger, the inauthentic responder performs an operation to fabricate the ID of an authentic responder and emit a response signal. In this case, the risk of such a possibility is eliminated by using the present invention.

Also, with respect to the RFID authenticity determination process in Step S8 in FIG. 5, there are two methods including (1) whether or not there is a waveform pattern of the random waveform of the interrogation signal Q in the response signal R, and (2) whether or not a waveform obtained by removing the random waveform element from the response signal R is provided with a waveform pattern of an interrogation request signal Q0.

(1) Whether or not there is a waveform pattern of the random waveform of the interrogation signal Q in the response signal R FIG. 6 includes waveform diagrams showing a step of generating the interrogation signal Q generated by the random waveform generator 23, and the response signal R received by the transceiver 24.

Figure 6A:
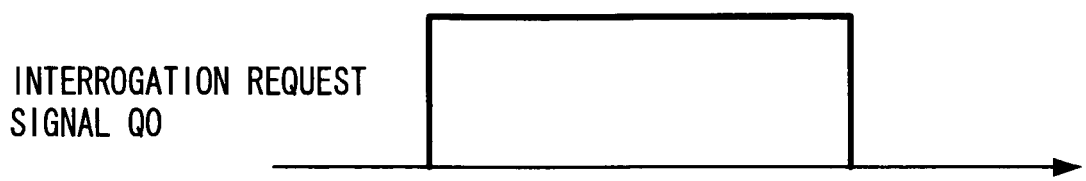
FIGS. 6A to 6E show waveform diagrams for illustrating an authenticity determination process in one RFID.
Figure 6B:
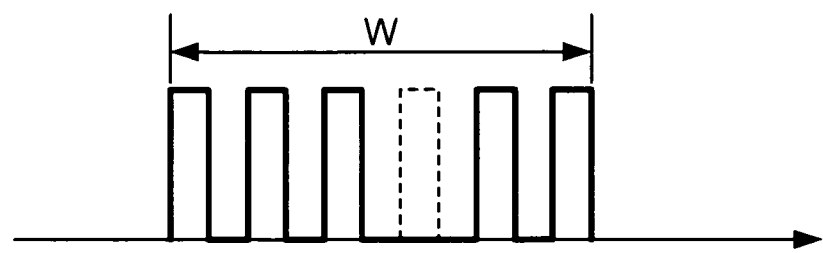

For example, the random waveform generator 23, based on the interrogation request signal Q0 (FIG. 6A), which is one pulse waveform, generates a basic waveform, which is a pulse train including six pulse waveforms, and generates a random waveform by switching these pulse waveforms on or off. FIG. 6B shows an example in which the random waveform was generated by switching off the fourth pulse waveform.

Following is a description of, an example of the RFID authenticity determination process in Step 8 in FIG. 5.

When sending the interrogation signal Q, the controller 21 stores the interrogation signal Q in the RAM 21C. On the other hand, the interrogation signal Q, which is the random waveform generated in the manner described above, is received, and the response signal R sent as a reply from the RFID 10 is also stored in the RAM 21C by the controller 21. Then, the authenticity determination is performed by comparing the interrogation signal Q to the response signal R.

Here, in order to determine whether or not there is a waveform pattern of the random waveform of the interrogation signal Q in the response signal R, a determination is made of whether or not the waveform width of the response signal R matches the waveform width of the interrogation signal Q, and a determination is made of whether or not a pulse waveform corresponding to an individual pulse waveform of the interrogation signal Q is present in the response signal R.

Figure 6C:
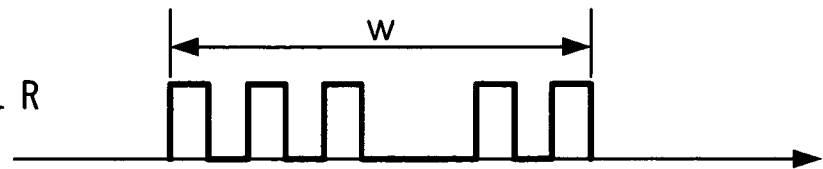

When the received response signal R is as shown in FIG. 6C, because a width W of the random waveform of the interrogation signal Q. i.e., the width of the pulse train, matches a width w of the pulse train of the response signal R, and also a pulse waveform corresponding to an individual pulse waveform of the interrogation signal Q is present in the response signal R, the controller 21 determines that a waveform pattern of the random waveform of the interrogation signal Q is present in the response signal R. Thus the controller 21 can determine that the RFID 10 that sent this response signal R as a reply is an authentic RFID.

Figure 6D:
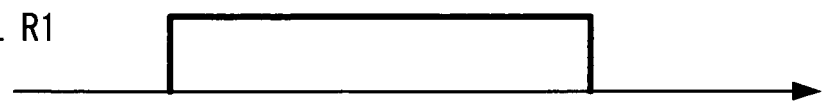

On the other hand, when a response signal R1 as shown in FIG. 6D is received, the controller 21 performs the same comparison. In this case, as is clear from FIG. 6D, although the width of the waveform of the response signal R1 is the same as the width of the pulse train of the interrogation signal Q, a pulse waveform corresponding to an individual pulse waveform of the interrogation signal Q is not present in the response signal R1. Thus, the controller 21 determines that the RFID 10 which sent this response signal R1 as a reply is a counterfeit RFID.

Figure 6E:

Further, when a response signal R2 as shown in FIG. 6E is received, the controller 21 determines that while the width of the response signal R2 matches the width of the pulse train of the interrogation signal Q, the pulse waveform corresponding to the fourth pulse waveform of the interrogation signal Q is present in the response signal R2. Thus, the controller 21 determines that the RFID 10 that sent this response signal R2 as a reply is not authentic.

The determination of whether or not a pulse waveform corresponding to an individual pulse waveform of the interrogation signal Q is present in the response signal R may be performed by comparing only the portions of the interrogation signal Q in which the pulse waveform is turned off, or it may be performed by calculating a wave peak value of the response signal R from the attenuation rate α stored in the RAM 21B in advance and comparing that wave peak value to the wave peak value when the pulse waveform is switched on, or the determination may be performed by comparing pulse waveforms both when turned on and when turned off.

(2) Whether or not a waveform obtained by removing the random waveform element from the response signal R is provided with a waveform pattern of an interrogation request signal Q0.

FIG. 7 includes waveform diagrams showing a step of generating the interrogation signal Q generated by the random waveform generator 23, and the response signal R received by the transceiver 24.

Figure 7A:
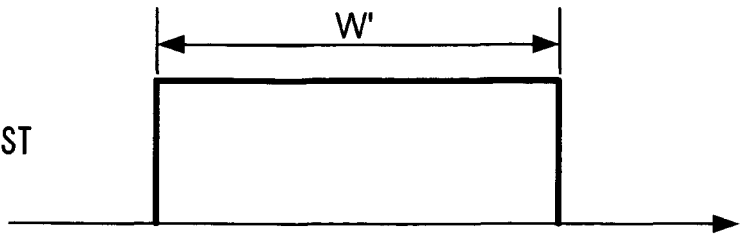
FIGS. 7A to 7F show waveform diagrams for illustrating an authenticity determination process in another RFID.
Figure 7B:
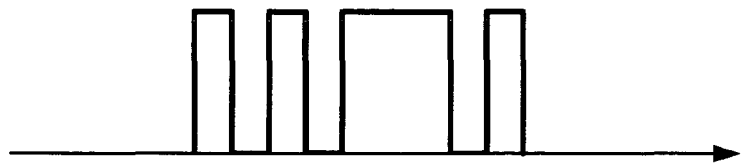
Figure 7C:
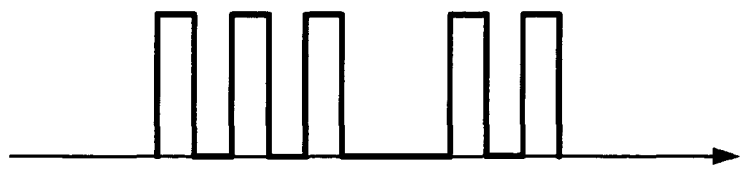
Figure 7D:
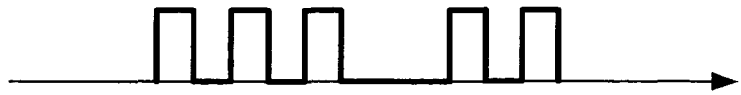
Figure 7E:

For example, the random waveform generator 23, based on the interrogation request signal Q0 (FIG. 7A), which is one pulse waveform, generates a basic waveform, which will be a pulse train including six pulse waveforms, and generates a random waveform by switching these pulse waveforms on or off. FIG. 7C shows an example in which the random waveform was generated by switching off the fourth pulse waveform. In this case, the interrogation signal Q (FIG. 7C) in obtained by subtracting a thinned signal T (FIG. 7B) from the interrogation request signal Q0. That is, the thinned signal T is a signal for encrypting the interrogation request signal Q0.

Following is a description of another example of the RFID authenticity determination process in Step 8 in FIG. 5

When sending the interrogation signal Q, the controller 21 stores the interrogation request signal Q0 and the thinned signal T in the RAM 21C. On the other hand, the response signal R (FIG. 7D) sent as a reply from the RFID 10 in response to receiving the interrogation signal Q, which is the random waveform generated in the manner described above, is also stored in the RAM 21C by the controller 21.

Then, the controller 21 performs the authenticity determination by performing a decrypting process in which the encrypted portion is removed from the response signal R, and comparing a revised response signal R0 to the interrogation signal Q0.

Specifically, the controller 21 generates a correction signal M (FIG. 7E) obtained by multiplying the thinned signal T stored in the RAM 21C by the attenuation rate α, and generates the revised response signal R0 by adding this correction signal M to the response signal R.

The controller 21 determines whether or not the waveform patterns match by comparing the interrogation request signal Q0 stored in the RAM 21C to the revised response signal R0. This determination is made according to whether or not a waveform width W' of the interrogation request signal Q0 matches a waveform width w' of the revised response signal R0, or whether or not the change in the waveform of the interrogation request signal Q0 analogizes the change in the waveform of the revised response signal R0.

Figure 7F:
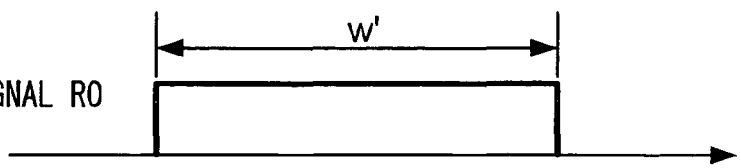

That is, when the revised response signal R0 as shown in FIG. 7F has been obtained, this revised response signal R0 matches a waveform obtained by multiplying the interrogation request signal Q0 by the attenuation rate α, so it is possible to determine that the RFID 10 that sent the response signal R, which is the source of the revised response signal R0, as a reply is an authentic RFID.

On the other hand, when a response signal R1 as shown in FIG. 6D or a response signal R2 as shown in FIG. 6E has been received, when the correction signal M is added to generate the revised response signal R0, it is clear that the revised response signal R0 has a waveform that differs from the waveform of the interrogation request signal Q0, and so the controller 21 determines that the RFID 10s that sent these response signals R1 and R2 as a reply are counterfeit RFIDs.

As described above, the RFID 10 receives the interrogation signal Q and then performs a conversion of electrical signal→mechanical signal→electrical signal→wireless signal. Thus, although the timing of the response signal R reflected by the RFID 10 is delayed relative to the signal of the interrogation signal Q, basically the waveform of the interrogation signal Q does not deteriorate much. Focusing on that fact, by adopting a random waveform for the interrogation signal Q that differs each time the interrogation signal Q is sent, it is possible to use the interrogation signal Q as a one-time password for the RFID 10 that receives the interrogation signal Q. interrogation unit 20 periodically. In this case, the processing operation is automatically started when the user brings the RFID 10 near the interrogation unit 20.

In the authentication process, authentication was performed by reading an ID number in advance, and reading an ID signal corresponding to this ID number from the characteristic table 22A and comparing this signal to a measured ID-received signal. However, the present invention is not limited to such a configuration; a configuration may also be adopted in which without storing an ID number, the ID-received signal is searched for each ID signal in the characteristic table 22A, a matching ID signal is extracted, and the ID number is identified from this ID signal. This ID number becomes an authenticated ID number.

2. Second Exemplary Embodiment

Following is a description of a second exemplary embodiment of the present invention. This exemplary embodiment is characterized in that it is configured as an authentication system employing a portable telephone provided with an RFID. In this exemplary embodiment, the same constituent elements as in the first exemplary embodiment described above are given the same reference numerals, and a description thereof is omitted.

2-1. Configuration

Figure 8:
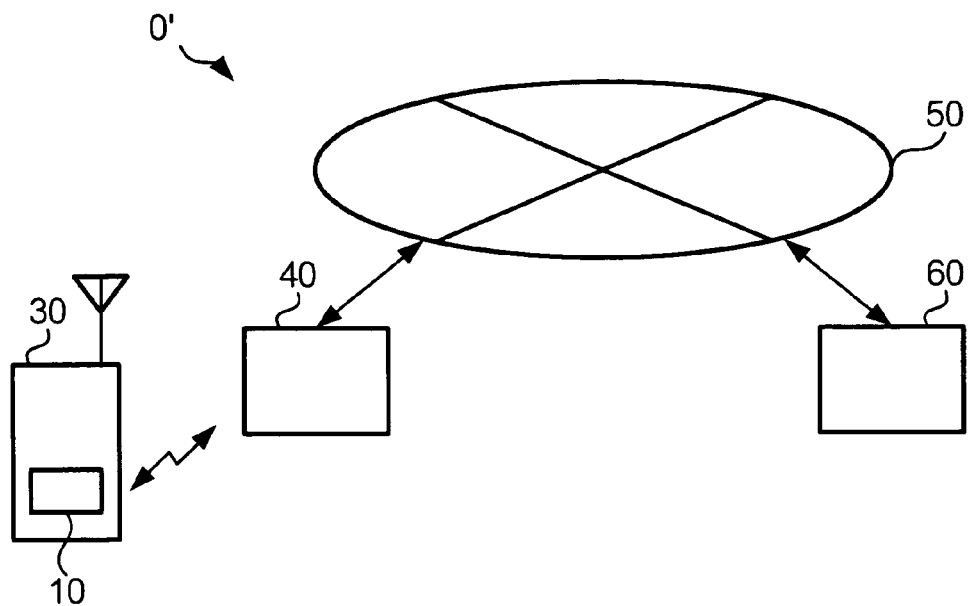
FIG. 8 is an overall configuration diagram that shows an authentication system according to a second exemplary embodiment.

FIG. 8 is an overall configuration diagram of an authentication system according to the present exemplary embodiment.

An authentication system 0' is provided with a portable telephone 30 including the RFID 10, an interrogation unit 40 that wirelessly gives/receives a signal to/from the RFID 10 and the portable telephone 30, and a management server connected to the interrogation unit 40 via a network 50.

Figure 9:
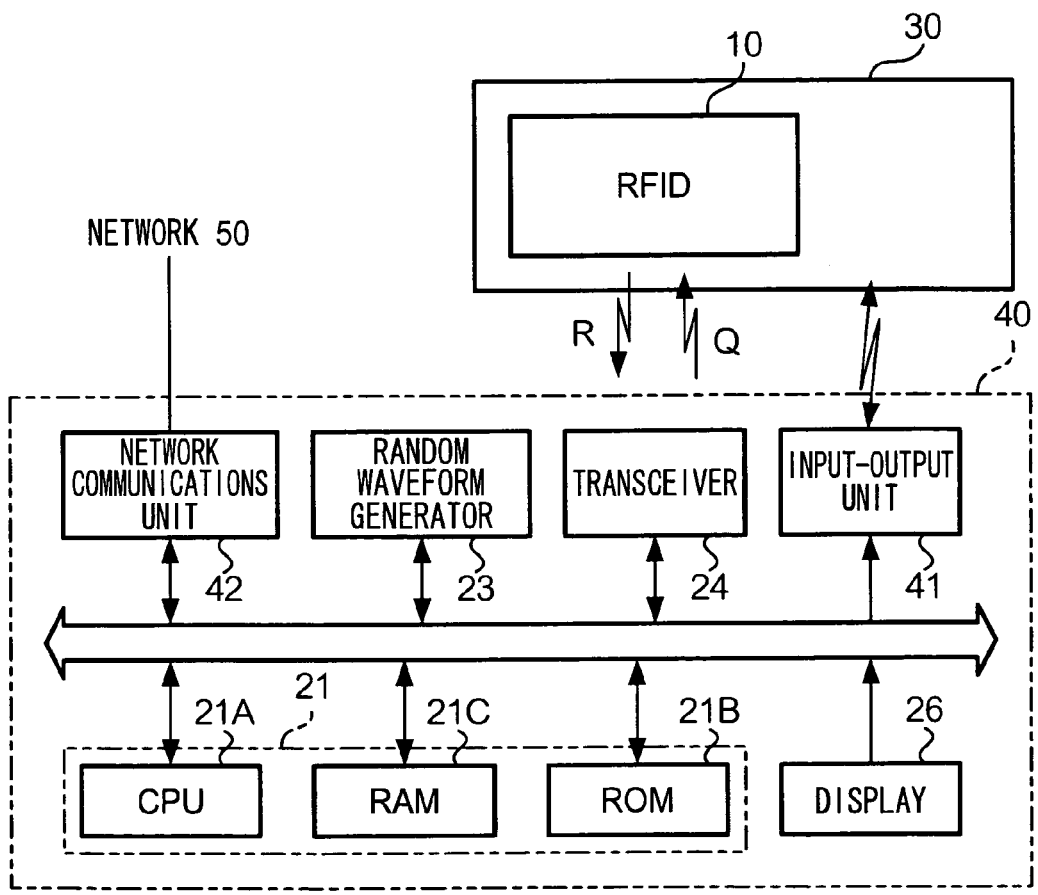
FIG. 9 is a block diagram that shows an authentication system according to a second exemplary embodiment.

As shown in FIG. 9, the interrogation unit 40 includes the controller 21, the random waveform generator 23, the transceiver 24, the display 26, an input-output unit 41, and a network communications unit 42.

Here, the input-output unit 41 performs short-range wireless communications with the portable telephone 30 such as Bluetooth (registered trademark) or infrared communications, and when it is necessary for the user in possession of the portable telephone 30 to perform an individual authentication process, an authentication request signal is sent to the controller 21 via the input-output unit 41. The controller 21 receives this authentication request signal and then sends an instruction signal to the random waveform generator 23, and with the random waveform generator 23, as described in the first exemplary embodiment, an interrogation signal Q that is a random waveform is generated.

The network communications unit 42 is an interface for connecting the interrogation unit 40 to the network 50.

ID signals corresponding to ID numbers are stored in a database of the management server 60 as a characteristic table. In the case of the present exemplary embodiment, the ID numbers are stored as potable telephone numbers. Also, in the management server 60, based on the characteristic table, a process of authenticating the RFID 10 from an ID number sent from the interrogation unit 40 and an ID-received signal (a signal corresponding to the propagation time T2) is performed.

2-2. Operation

Following is a description of the process of authenticating the RFID 10 according to the second exemplary embodiment.

Figure 10:
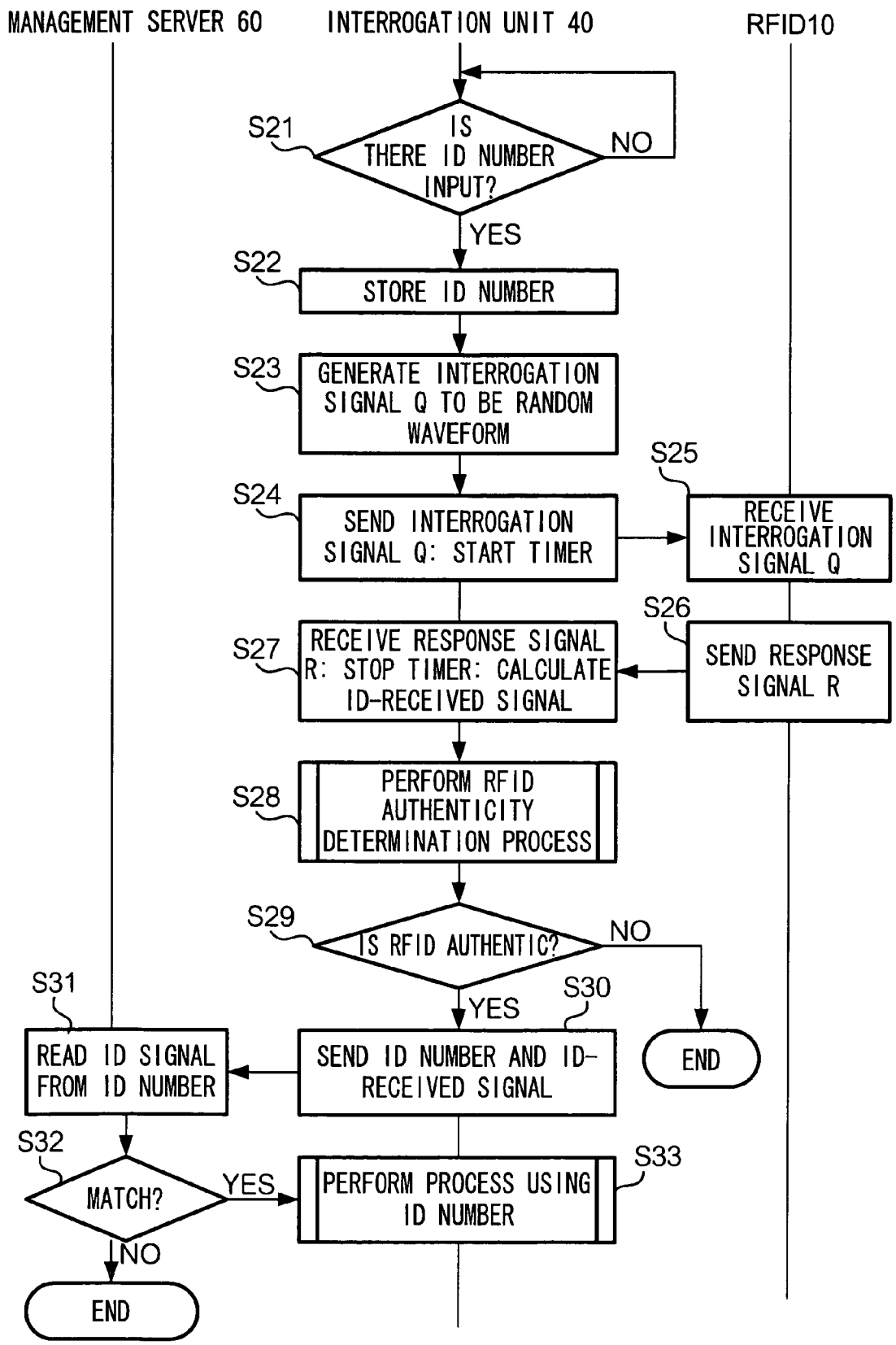
FIG. 10 is a sequence chart that shows an authentication system according to the second exemplary embodiment.

FIG. 10 shows a sequence chart of the authentication process.

First, the controller 21 waits for a user to input an authentication request signal and an ID number using the portable telephone 30 (Step S21). In the controller 21, when a signal of the user instructing an authentication inquiry is sent from the portable telephone 30, along with this signal, the number of the portable telephone is received via the input-output unit 41 as an ID number (Step S21; Yes). The controller 21 temporarily stores the input ID number (telephone number) in the RAM 21C (Step S22).

Next, the controller 21 generates an interrogation signal Q, which is a random waveform, with the random waveform generator 23 (Step S23). Further, the controller 21 converts this interrogation signal Q into a wireless signal and sends it to the RFID with the transceiver 24, and starts a timer (Step S24).

The sent interrogation signal Q is received by the RFID 10 (Step S25), the operation described above is performed, and a response signal R corresponding to an individual RFID 10 is sent as a reply (Step S26).

When the response signal R is received by the transceiver 24, the controller 21 stops the timer, measures the time from sending of the interrogation signal Q to receipt of the response signal R, and stores this time in the RAM 21C as an ID-received signal (Step S27).

The controller 21 performs the same RFID authenticity determination process as described above in the first exemplary embodiment (Step S28), and when the controller 21 has determined that the RFID 10 is authentic (Step S29; Yes), the controller 21 shifts to the processing of Step S30, and when the controller 21 has determined that the RFID 10 is not authentic (Step S29; No), the controller 21 displays that the RFID is not authentic on the display 26 and ends this process. In this case, all subsequent processing is prohibited.

On the other hand, when the controller 21 determines that the RFID 10 is authentic (Step S29; Yes), the controller 21 reads an ID number and ID-received signal stored in the RAM 21C, and sends the read ID number and ID-received signal to the management server 60 via the network communications unit 42 and the network 50 in order to perform the authentication process in the management server 60 (Step S30).

In the management server 60, an ID signal is read from an ID number stored in the characteristic table (Step S31), and the read ID signal is compared to the ID-received signal (Step S32).

When the ID signal and the ID-received signal match (Step S32; Yes), a signal displaying "Authentication successful" is sent to the interrogation unit 40 via the network 60, and in the interrogation unit 40 a process using an ID number, such as a settlement process for example, is started in response to the signal displaying "Authentication successful".

On the other hand, in the management server 60, when the ID signal and the ID-received signal do not match (Step S32; No), this process ends. In this case, a signal displaying "Authentication not successful" may be sent to the interrogation unit 40, and a message may be displayed on the display 26 that all subsequent processing is prohibited.

In the second exemplary embodiment, same as in the first exemplary embodiment, in addition to being able to suppress counterfeiting of the RFID 10, the authentication process is performed with the management server 60, so it is not necessary to include a characteristic table in the interrogation unit, which has a limited storage capacity, and so it is possible to store information for a large number of RFIDs. Further, by providing an RFID 10 in the portable telephone 30, direction communications from the portable telephone 30 to the management server 60 are possible, and thus the scope of use can be expanded in comparison to the case of only an RFID.

2-3. Modified Example of Second Exemplary Embodiment

Following is a description of a modified example of the second exemplary embodiment.

In the second exemplary embodiment, only an authentication process was provided in the management server 60, but a configuration may also be adopted in which the interrogation unit 40 includes the controller 21, the transceiver 24, the display 26, the input-output unit 41, and the network communications unit 42, and the random waveform generator 23 is provided in the management server 60.

In the second exemplary embodiment, an example was described in which when an authentication request is made from the portable telephone 30, that request is made from the portable telephone 30 with short-range wireless communications such as Bluetooth (registered trademark) or infrared communications, but the present invention is not limited to such a configuration; an authentication request may also be made directly from the portable telephone 30 to the management server 60.

Figure 11:
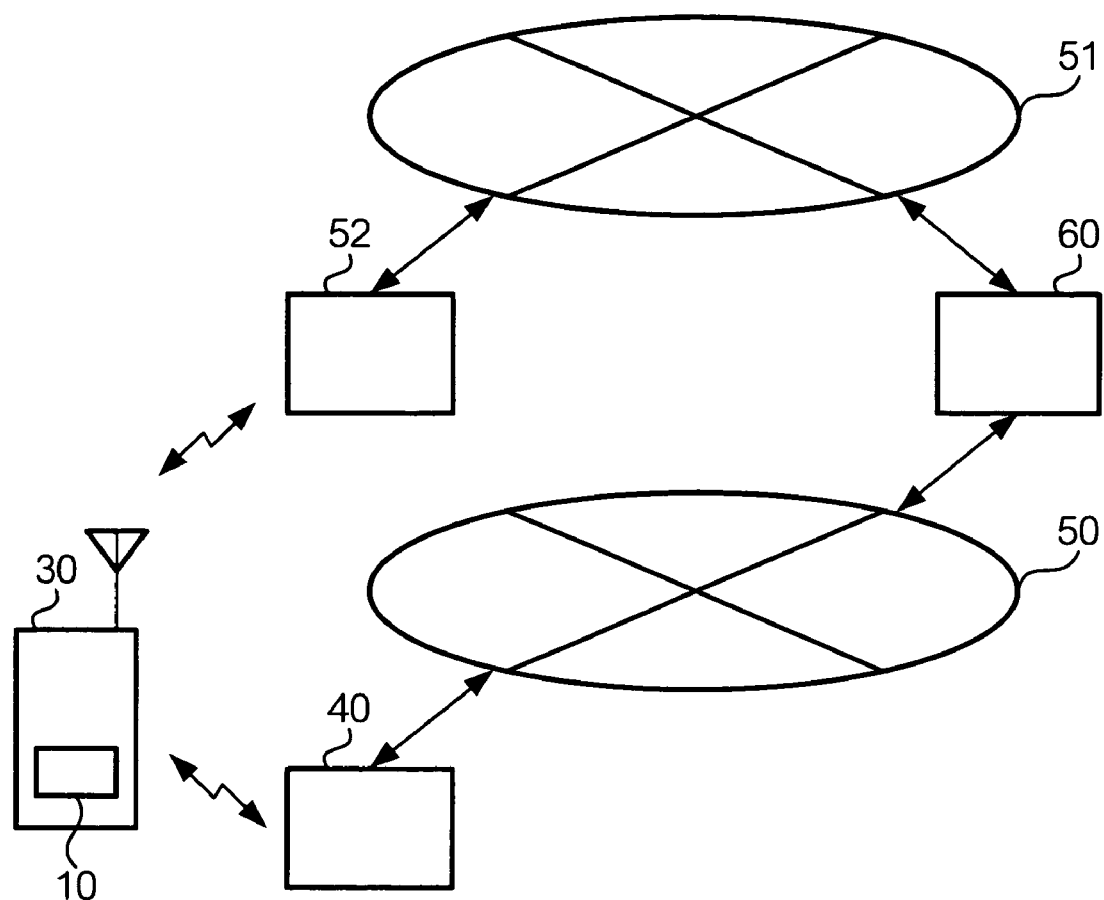
FIG. 11 is an overall configuration diagram that shows an authentication system according to a modified example of the second exemplary embodiment.

In this case, as shown in FIG. 11, the portable telephone 30 and the management server 60 are connected with a mobile communications network 51, and an ID number and a unique number of the interrogation unit 40 are sent from the portable telephone 30 to the management server 60 via a base station 52 and the mobile communications network 51. This unique number is a unique number decided for each interrogation unit 40, and a label on which the unique number is printed is affixed to the case of the interrogation unit 40 such that it is visible to the user. An arrangement is adopted such that if this unique number is sent to the management server 60, in the management server 60 it is understood with which interrogation unit 40 the user is attempting to perform the authentication process with.

Thus, in the interrogation unit 40, with respect to the signal sent in Step S30 in FIG. 10, by merely sending to the management server 60 only the calculated ID-received signal, it is possible to allow the management server 60 to perform the authenticity determination process and the authentication process of the RFID 10. Thus, in comparison to performing those processes within the interrogation unit 40, it is possible to lighten the operating load in the interrogation unit 40.

In the second exemplary embodiment, an example was described in which the RFID 10 was provided in the portable telephone 30, but the RFID is not limited to being provided in a portable telephone. The RFID 10 may be provided in anything provided with a communications function, such as a PDA (personal digital assistant) or a portable personal computer.

3. Other Examples

The present invention is not limited to the exemplary embodiments described above; various forms of the invention are possible.

In the exemplary embodiments described above, a random waveform was generated by switching six pulses on or off, but the present invention is not limited to such a configuration. The random waveform may also be a waveform randomized with respect to time, a waveform randomized with respect to frequency, a waveform randomized with respect to phase, or a waveform randomized with respect to wave peak value; a random waveform may be generated in any manner as long as a random waveform is sent that is determined each time an interrogation signal Q is sent.

The authenticity determination may also be determined by comparing the width of the random waveform in the interrogation signal Q to the width of the random waveform in the response signal R.

In the RFID 10 used in each of the exemplary embodiments described above, by way of example, one pair of inter-digital transducers was formed, but the present invention also encompasses a configuration in which multiple pairs of inter-digital transducers are formed.

Figure 12:
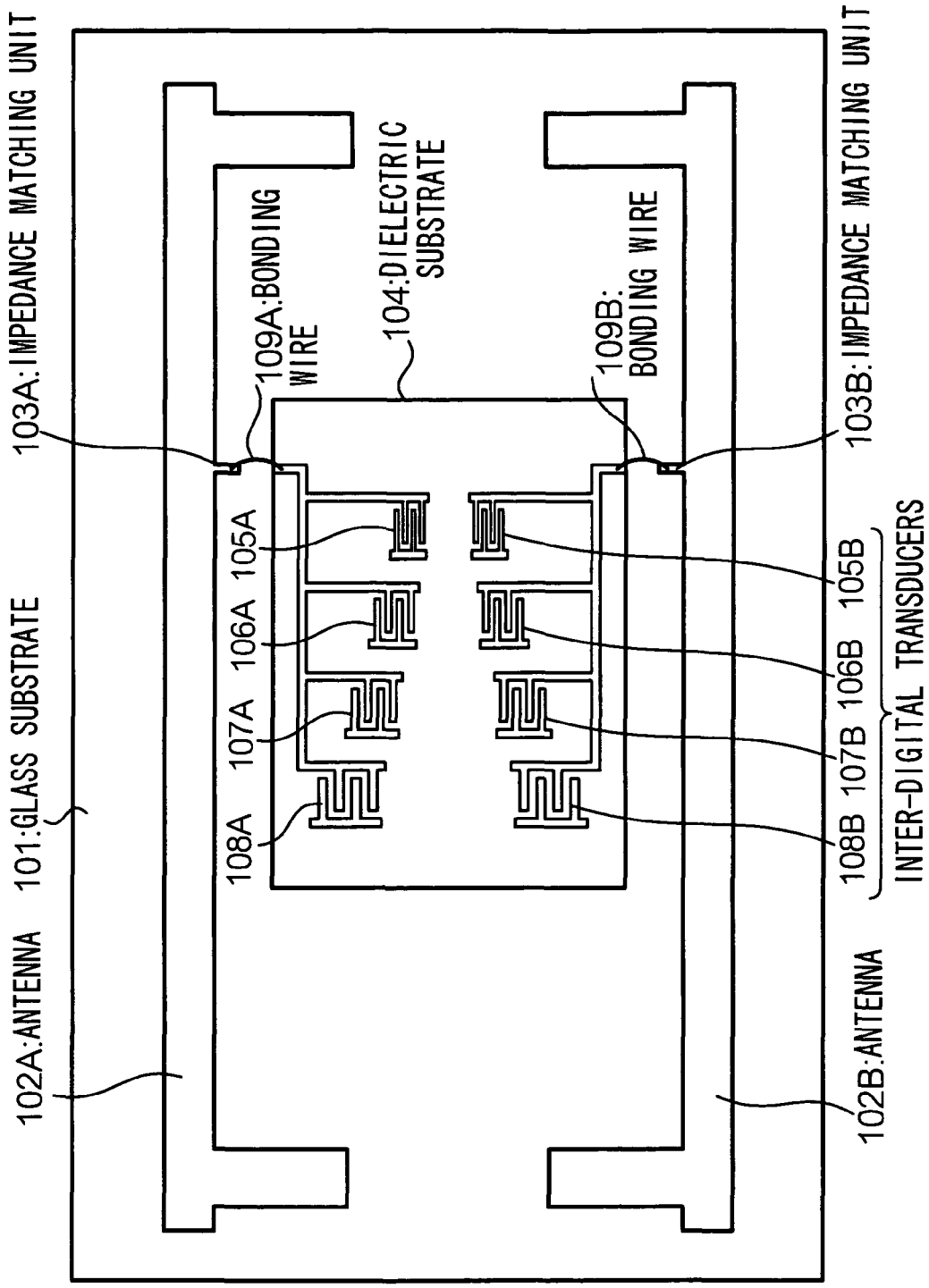
FIG. 12 shows an RFID according to a modified example.

FIG. 12 is a plan view that shows an example of an RFID 100 in which four pairs of inter-digital transducers are formed.

This RFID 100 includes a rectangular glass substrate 101, a dielectric substrate 104 formed in the central portion of the glass substrate 101 in order for a surface acoustic wave to propagate, antennas 102A and 102B formed on a surface where the dielectric substrate 104 has been removed on the two lengthwise sides of the glass substrate 101 such that the antennas 102A and 102B extend in the lengthwise direction, impedance matching units 103A and 103B extended from the antennas 102A and 102B toward the dielectric substrate 104, four pairs of inter-digital transducers 105A and 105B, 106A and 106B, 107A and 107B, and 108A and 108B, formed on the dielectric substrate 104 and each having differing conditions for resonance (separation distance), and wire bondings 109A and 109B that connect the impedance matching units 103A and 103B to sites where one end of each of the four pairs of inter-digital transducers has been connected.

Also in the case of an RFID 100 configured in this manner, due to receiving an interrogation signal Q, which is a random waveform, from the interrogation unit 20 (40) described in each of the above exemplary embodiments, a response signal R is sent as a reply to the interrogation signal Q. In the case of the RFID 100, four response signals R are sent as replies to the interrogation signal Q. The authenticity determination process described above may be performed for each of the response signals. In this case, because the determination process is performed for each response signal, the accuracy of determining fakery by a counterfeit RFID is also improved.

In each of the above exemplary embodiments, by way of example a case was described in which the RFID 10 is used for authentication, but by modifying the material or the structure of the dielectric body, a wireless sensor, provided with an ID number, that measures a physical quantity such as temperature, humidity, pressure, or the amount of light, may be used as the RFID.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A responder authenticity determination system, comprising:
    a responder that sends a response signal in response to a received signal;
    an interrogation signal generator that generates an interrogation signal having a random waveform;
    a memory storing a plurality of responder identifications and a plurality of predetermined propagation times in correspondence with each other;
    a transmitter that transmits the generated interrogation signal to the responder;
    a receiver that receives the response signal from the responder; and
    a controller that:
        generates a start timer signal upon the transmitter transmitting the generated interrogation signal to the responder,
        generates a stop timer signal upon the receiver receiving the response signal,
        determines authenticity of the responder based on the received response signal and the random waveform of the generated interrogation signal, and
        if the responder is determined to be authentic, determines identification of the responder using a time between the start timer signal and the stop timer signal, and the propagation times stored in the memory to find a corresponding responder identification.

2. The responder authenticity determination system according to claim 1, wherein:
    the interrogation signal generator generates the interrogation signal based on an interrogation request signal; and
    the controller revises the received response signal by removing the random waveform from the received response signal, and compares the interrogation request signal with the revised response signal.

3. The responder authenticity determination system according to claim 1,
    wherein the controller determines authenticity according to whether the random waveform is present in the response signal.

4. The responder authenticity determination system according to claim 1,
    wherein the responder comprises:
    an excitation unit that generates mechanical vibration upon receipt of the interrogation signal;
    a surface acoustic wave generator that allows the mechanical vibration to propagate in the responder, so as to generate a surface acoustic wave; and
    a converter that converts the surface acoustic wave into an electrical signal and outputs the electrical signal as the response signal.

5. The responder authenticity determination system according to claim 1,
    wherein the random waveform is a waveform randomized with respect to time.

6. The responder authenticity determination system according to claim 1,
    wherein the random waveform is a waveform randomized with respect to frequency.

7. The responder authenticity determination system according to claim 1,
    wherein the random waveform is a waveform randomized with respect to phase.

8. The responder authenticity determination system according to claim 1,
wherein the random waveform is a waveform randomized with respect to amplitude.

9. An interrogation unit comprising:
an interrogation signal generator that generates an interrogation signal having a random waveform;
a memory storing a plurality of responder identifications and a plurality of predetermined propagation times in correspondence with each other;
a transmitter that transmits the generated interrogation signal to a responder;
a receiver that receives a response signal from the responder; and
a controller that:
  generates a start timer signal upon the transmitter transmitting the generated interrogation signal to the responder,
  generates a stop timer signal upon the receiver receiving the response signal,
  determines authenticity of the responder based on the received response signal and the random waveform of the generated interrogation signal, and
  if the responder is determined to be authentic, determines identification of the responder using a time between the start timer signal and the stop timer signal, and the propagation times stored in the memory to find a corresponding responder identification.

10. An authenticity determination method, comprising:
storing a plurality of responder identifications and a plurality of predetermined propagation times in correspondence with each other;
generating an interrogation signal having a random waveform in an interrogation unit;
transmitting the interrogation signal from the interrogation unit to a responder;
generating a start timer signal upon transmitting the interrogation signal to the responder;
transmitting, upon receipt of the interrogation signal, a response signal from the responder to the interrogation unit;
generating a stop timer signal upon receipt of the response signal at the interrogation unit;
determining, in the interrogation unit, authenticity of the responder based on the response signal received from the responder and the random waveform of the generated interrogation signal; and
if the responder is determined to be authentic, determining identification of the responder by comparing a time between the start timer signal and the stop timer signal with the stored propagation times to find a corresponding responder identification.

* * * * *